US006816531B1

United States Patent
Rossin et al.

(10) Patent No.: US 6,816,531 B1
(45) Date of Patent: Nov. 9, 2004

(54) HIGH-POWER, KINK-FREE, SINGLE MODE LASER DIODES

(75) Inventors: Victor Rossin, Mountain View, CA (US); Ross A. Parke, Fremont, CA (US); Jo S. Major, San Jose, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/518,421

(22) Filed: Mar. 3, 2000

(51) Int. Cl.[7] .............................. H01S 5/00; H01S 3/20; H01S 3/03; G02B 6/10
(52) U.S. Cl. ............................. 372/64; 372/43; 372/50; 372/45; 372/54; 385/132
(58) Field of Search ............................. 372/64, 43, 45, 372/46, 50, 54, 66, 49, 44, 96, 97, 108, 102; 385/132, 43, 49

(56) References Cited

U.S. PATENT DOCUMENTS

| 4,251,780 A | | 2/1981 | Scifres et al. | |
|---|---|---|---|---|
| 4,349,905 A | * | 9/1982 | Ackley | 372/46 |
| 4,689,797 A | | 8/1987 | Olshansky | |
| 4,783,788 A | * | 11/1988 | Gordon | 372/45 |

(List continued on next page.)

FOREIGN PATENT DOCUMENTS

| EP | 1 052 747 A2 | | 11/2000 | |
|---|---|---|---|---|
| IT | PCT WO 01/48874 | * | 5/2001 | 372/46 |
| JP | 02020089 | | 1/1990 | H01S/3/18 |
| JP | 09307181 | | 11/1997 | H01S/3/18 |
| JP | 2000200940 | | 7/2000 | H01S/5/065 |
| WO | WO 00/48276 | | 8/2000 | H01S/5/00 |

OTHER PUBLICATIONS

Tamanuki et al, High power and narrow lateral far field divergence, Sep. 5, 1995, IEEE, 725–728,.*
Welch, D.F. et al., *High power, AlGaAs buried heterostructure lasers with flared waveguides*, Appl. Phys. Lett. 50(5) Feb. 2, 1987, p. 233.
Sagawa, M. et al., *High–power and highly–reliable operation of 0.98–um lasers with an exponential–shaped flared stripe*, LEOS 1996, Boston, p. 42.
Takemasa Tamanuki, Tatsuya Sasaki and Mitsuhiro Kitamura: "High Power and Narrow Lateral Far Field Divergence 1.5um–Eye–Safe Pulse Laser Diodes with Flared Waveguide," Hokkaido, May 9–13, 1995, New York, IEEE, US, vol. CONF. 7, May 9, 1995, pp. 725–728.
"High–Power and Fundamental–Mode Oscillating Flared SBA Lasers" Electronics Letters 24 (1988) 1st Sep., No. 18, Stevenage, Herts., Gr. Britain, pp. 1182–1183.
Kink Power in Weakly Index Guided Semiconductor Lasers, Appl. Phys Lett 66 (B), Feb. 20, 1995, 1995 American Institute of Physics.

*Primary Examiner*—Don Wong
*Assistant Examiner*—Armando Rodriguez
(74) *Attorney, Agent, or Firm*—Allen, Dyer, Doppelt, Milbrath & Gilchrist, P.A.

(57) ABSTRACT

A high power, single lateral mode semiconductor laser has a waveguide with regions of different widths coupled by a tapered region. The laser has a laterally confining optical waveguide having a highly reflecting first end and a second end. The optical waveguide has a first portion extending from the first end and a second portion extending from the second end. The first and second portions are coupled by a tapered waveguide. A width of the first portion is less than a width of the second portion. The first portion filters lateral optical modes higher than a fundamental lateral optical mode. An output is emitted from the second end of the optical waveguide.

33 Claims, 9 Drawing Sheets

U.S. PATENT DOCUMENTS

| | | |
|---|---|---|
| 4,791,649 A | 12/1988 | Yamamoto et al. |
| 4,942,585 A | 7/1990 | Ungar |
| 4,961,197 A | 10/1990 | Tanaka et al. |
| 5,200,969 A | 4/1993 | Paoli |
| 5,309,465 A | 5/1994 | Antreasyan et al. |
| 5,484,481 A | 1/1996 | Linde et al. ................ 106/712 |
| 5,563,732 A | 10/1996 | Erdogan et al. ............ 359/341 |
| 5,574,743 A | 11/1996 | van der Poel et al. |
| 5,715,263 A | 2/1998 | Ventrudo et al. ............... 372/6 |
| 5,940,422 A | 8/1999 | Johnson |
| 5,960,020 A | 9/1999 | Nagai |
| 6,014,396 A | 1/2000 | Osinski et al. |
| 6,058,128 A * | 5/2000 | Ventrudo ..................... 372/96 |
| 6,094,515 A * | 7/2000 | Miki et al. .................... 385/31 |
| 6,229,947 B1 * | 5/2001 | Vawter et al. .............. 385/132 |
| 6,404,542 B1 | 6/2002 | Ziari et al. ............... 359/341.3 |

* cited by examiner

HIGH-POWER, KINK-FREE, SINGLE MODE LASER DIODES

FIELD OF THE INVENTION

The invention relates to semiconductor lasers, and more particularly to semiconductor laser diodes having a single lateral optical mode.

BACKGROUND

There is an increasing demand for high power semiconductors that operate in the fundamental spatial mode. The spatial mode can be considered to include two components, namely the transverse component, lying perpendicular to the layers forming the semiconductor junction and the lateral component, lying parallel to the junction layers. The light generated by the semiconductor laser is generally transversely confined by having cladding layers, of relatively low refractive index, on either side of the active layer, having a relatively high refractive index. Since the active layer is generally very thin, about 1 μm or so, a semiconductor laser usually emits light with a fundamental transverse component. However, a semiconductor laser typically requires lateral confinement in order to operate in the fundamental lateral mode. Lateral confinement may be provided, for example, by a buried heterostructure, a ridge waveguide or other structures that produce an effective difference in refractive index between the active region and the lateral region.

The requirement of fundamental lateral mode typically requires the width of the lateral waveguide to be small. However, this restricts the power available from the device, thus limiting its use in high power applications, such as pumping fiber amplifiers. Increasing the lateral width of the waveguide results in higher power, but also permits the oscillation of lateral modes higher than the fundamental mode, particularly at high operating powers. This leads to a reduction in the focusability of the output from the laser. Where the output from the laser is focused into a fiber, the reduction in focusability leads to a reduction in fiber coupling efficiency.

Therefore, there is a requirement for a laser that can operate at high powers while maintaining a single lateral mode.

SUMMARY OF THE INVENTION

Generally, the present invention relates to a high power, single lateral mode semiconductor laser that has a waveguide with regions of different widths coupled between a tapered region. The output from the laser is taken from the wide end of the waveguide.

In one particular embodiment of the invention, a light source includes a semiconductor laser having a laterally confining optical waveguide having a highly reflecting first end and a second end. The optical waveguide has a first portion extending from the first end and a second portion extending from the second end. The first and second portions are coupled by a tapered waveguide. A width of the first portion end is less than a width of the second portion. The first portion filters lateral optical modes higher than a fundamental lateral optical mode. An output is emitted from the second end of the optical waveguide.

Another embodiment of the invention is a fiber optic system, comprising a communications fiber including an excitable fiber medium, and a pump laser coupled to supply pump light to the excitable fiber medium. The pump laser includes a laterally confining optical waveguide having a highly reflecting first end and a second end. The optical waveguide has a first portion extending from the first end and a second portion extending from the second end. The first and second portions are coupled by a tapered waveguide. A width of the first portion end is less than a width of the second portion. The first portion filters lateral optical modes higher than a fundamental lateral optical mode. An output is emitted from the second end of the optical waveguide.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
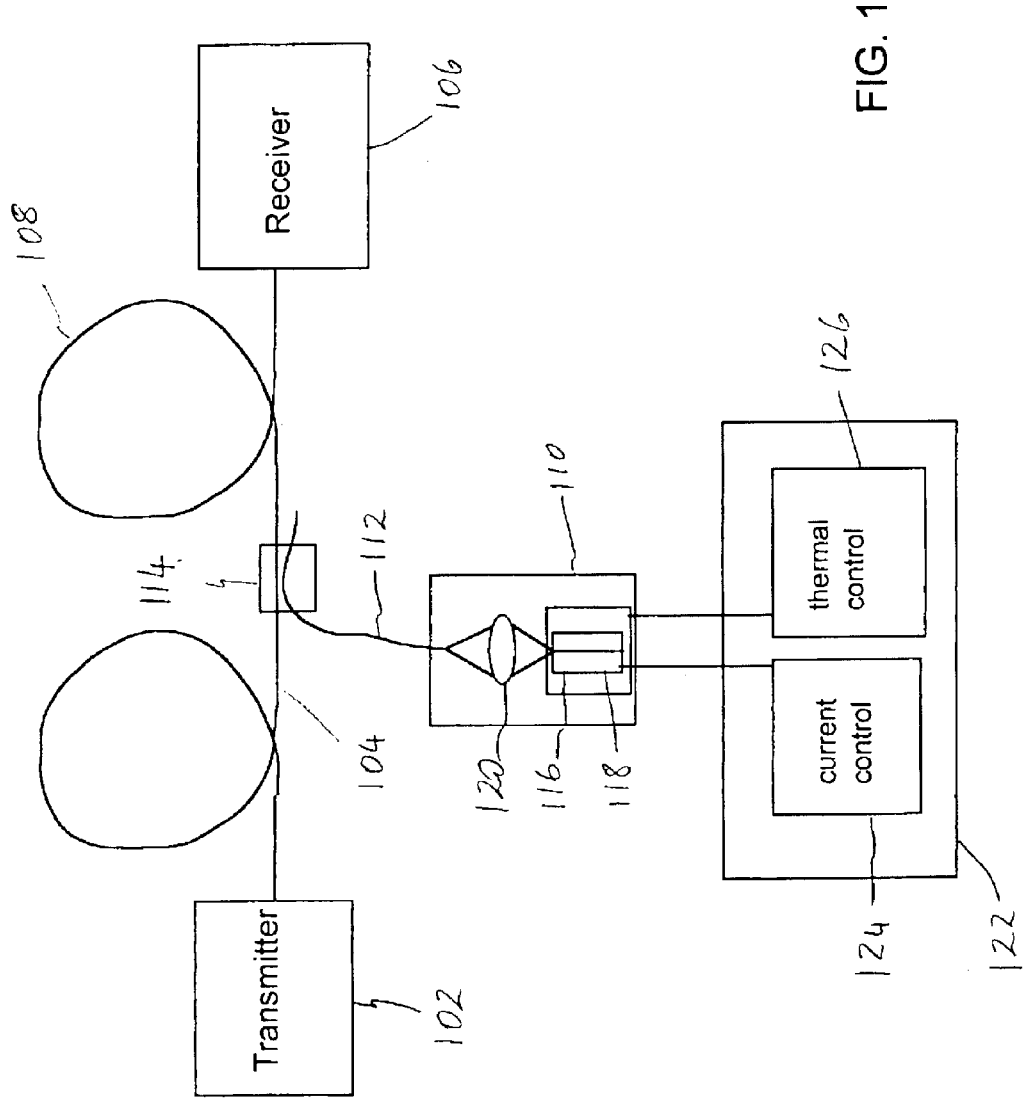
FIG. 1 schematically illustrates a fiber optic communications system incorporating a fiber amplifier and a fiber amplifier pump laser.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to waveguide semiconductor lasers operating in the fundamental lateral mode. One of the advantages of the invention is that the semiconductor laser can operate at high output power free from higher order lateral modes.

The onset of a higher order lateral mode in single stripe waveguide lasers results in a "kink" in the output power plotted against laser current, thus reducing the slope efficiency. Furthermore, a higher order lateral mode has different near and far field patterns, which do not match well to the optical mode of a single mode fiber. Therefore, the coupling efficiency of the laser's output into a single mode fiber, for example in an optical communications system, is reduced. In some applications, such as pumping fiber amplifiers in optical fiber communications systems, it is desirable that the laser diode produce a high output power that can be efficiently coupled into a fiber system. Therefore, the onset of higher order lateral modes may be deleterious to the laser's operation and should be avoided.

An optical fiber communication system is schematically illustrated in FIG. 1. A transmitter 102 generates an optical communications signal which is transmitted to a fiber optic communications link 104 that transports the communications signal to a receiver 106. Due to optical losses along the link 104, the communications signal loses amplitude. To counteract the losses, a fiber communications system often includes one or more active fiber devices 108, such as fiber amplifiers. A fiber amplifier may amplify the communications signal through stimulated emission, for example using a rare-earth dopant such as erbium (erbium-doped fiber amplifier, EDFA), or through a nonlinear interaction, for example using a fiber Raman amplifier (FRA).

A pump laser 110 is coupled via a coupling fiber 112 and a fiber coupler 114 to provide optical energy to the fiber amplifier 108. The pump laser 110 provides a high power pump signal, typically hundreds of milliwatts, at a selected wavelength to pump the amplifier 108. The pump laser 110 is typically art constructed from a laser diode chip 116 fixed on a mount 118. The mount 118 may include a submount, and provides electrical and thermal conduction paths to pass a current through the laser diode chip 116 and to remove heat generated in the chip 116. The optical output from the chip 116 is collected and focused by a lens system 120 into the coupling fiber 112.

The laser 110 may be attached to a controller 122, which controls the operation of the laser 110. The controller 122 may include a current controller 124 to control the current passing through the laser 110, and hence its output power. The current controller 124 may be operated to stabilize the current passing through the laser 110, or may be operated to stabilize the power output by the laser 110. The controller 122 may also include a thermal controller 126 to control the operating temperature of the laser 110. The thermal controller 126 may be adapted to control the cooling provided to the laser chip 116 by the mount 118. For example, if the mount 118 provides thermoelectric cooling, then the thermal controller 126 may control the amount of current passing through the thermoelectric cooler in order to control the amount of heat extracted from the laser chip 116 by the thermoelectric controller. A temperature sensor may be placed on or near the mount to measure the operating temperature of the chip 116 and to feed temperature information to the thermal controller 126. Thermal stability of the pump laser 110 is generally important, since optimal operation of the fiber amplifier 108 requires the light generated by the pump laser 110 be within a specific wavelength range.

Two important characteristics of the laser 110 are that the power be sufficiently high to be effective as a pump laser, and that the efficiency of coupling light into the fiber also be high. High coupling efficiency may be achieved by ensuring that the laser 110 operates in a single lateral mode, which may be achieved by narrowing the single mode waveguide in the laser. However, a reduction in waveguide width reduces the available output power. If the single mode waveguide is not sufficiently narrow as to discriminate against all higher order modes, then the output may include one or more higher order lateral modes, especially at high power. The onset of a higher order lateral mode is accompanied by a dip and rise in the curve of output power plotted against current, also referred to as the L-I characteristic. This dip and rise is referred as "kink", and is understood to be caused by a mixture of a first lateral spatial mode phase-locked with the fundamental lateral optical mode. This phenomenon is described further in "Kink power in weakly index guided semiconductor lasers", by M. F. Schemmann et al., Applied Physics Letters vol. 66, pp. 920–922, 1995, incorporated herein by reference.

The threshold power at which the first lateral mode begins to oscillate, also referred to as the kink power, depends, at least in part, on the width of the waveguide in the laser 110. If the waveguide is sufficiently narrow, then the first lateral mode may be eliminated. However, narrowing the waveguide increases the losses for the fundamental lateral mode, thus decreasing the laser slope efficiency. Having a narrow active region also results in high current density, resulting in non-linear effects such as spectral hole burning, and also results in high thermal and series resistances.

Figure 2A:
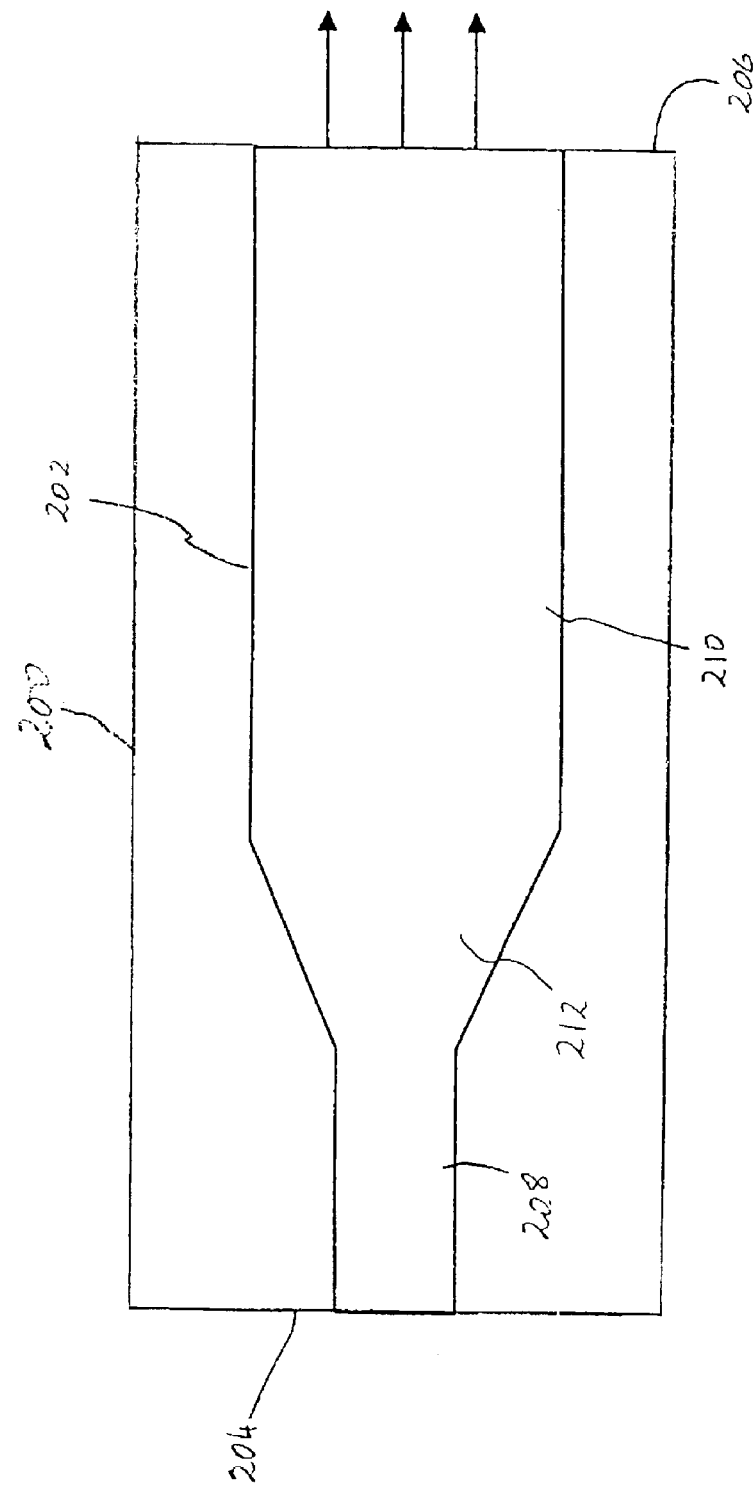
FIG. 2A schematically illustrates a laser waveguide according to an embodiment of the invention.

One approach to overcome these problems is to use a laterally confining waveguide in the laser that has regions of different width. One particular embodiment of such a laser is illustrated in FIG. 2A. The laser waveguide 202 lies between two ends 204 and 206 of the laser 200. The ends 204 and 206 may be cleaved surfaces that are coated with dielectric coatings. The first end 204 is provided with a highly reflective coating. The second end 206 is provided with an antireflection coating and operates as the output end for the laser 200.

The waveguide 202 has a relatively narrow region 208 extending from the first end 204, and a relatively wide region 210 extending from the output end 206. A tapered region 212 couples between the narrow and wide regions 208 and 210.

The tapered region 212 is preferably sufficiently long as to permit a relatively low loss transformation of the fundamental lateral mode from the narrow region 208 to the wide region 210, and may be approximately 100 $\mu$m in length or more. A tapered region 212 whose length is significantly shorter introduces additional losses to the laser which are deleterious. The length of the tapered region 212 determines, at least in part, the magnitude of the coupling loss between the narrow and wide regions 208 and 210: a longer taper length reduces the coupling loss, while a shorter taper length increases the coupling loss. The coupling loss between the narrow and wide regions 208 and 210 is at a maximum when the taper has no length, and the narrow region couples directly to the wide region.

When the coupling loss is relatively low, because of a relatively long taper length, the laser discriminates against the higher order lateral modes as a result of the higher propagation losses for the higher order lateral modes in the narrow region 208. This contrasts with lasers that have no tapered region, where the narrow region is coupled directly to the wide region. In such a case, the major discriminating loss preventing the appearance of higher order modes is the coupling loss between the narrow and wide regions. The fundamental mode also experiences high losses in such a system. One of the advantages of using a tapered region 212 to couple between the narrow and wide regions 208 and 210 is that the lower coupling losses, particularly for the fundamental mode, lead to a higher overall laser efficiency. By having a region that is relatively wide, the waveguide 202 also increases the thermal and electrical characteristics of the laser diode by decreasing current density and junction temperature at high power operation.

Figure 2B:
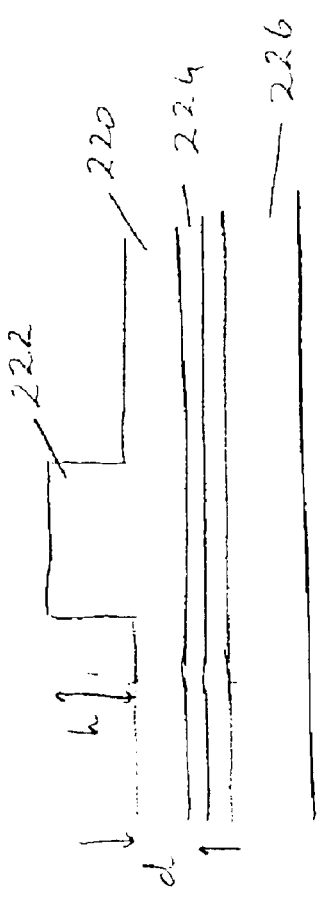
FIGS. 2B and 2C schematically illustrate cross-sectional views of different embodiments of lateral confinement semiconductor lasers.

The lateral waveguide may be formed using any one of a number of approaches. For example, the waveguide may be formed as a ridge or as a buried heterostructure. One particular embodiment of a ridged lateral waveguide is illustrated in FIG. 2B, which schematically shows a cross-sectional view of the laser 200 transverse to the waveguide 202. The upper cladding layer 220 is typically a p-doped layer that includes a ridge 222. The active layer 224 may be a single or multiple quantum wells that are bounded on the lower side by the lower cladding layer 226, which is typically an n-doped layer. The refractive index of the active layer is higher than the refractive indices of the upper or lower cladding layers 220 and 226.

The lateral waveguide is formed by the ridge 222 in the upper cladding layer 220. The waveguiding effect arises from the large refractive index difference between the ridge and the surrounding air. The effective refractive index difference for the confined mode is dependent on how much of the mode penetrates into the ridge. Accordingly, the effective refractive index for the guided mode is dependent on the depth of the upper cladding layer 220 and the height of the ridge 222.

Figure 2C:
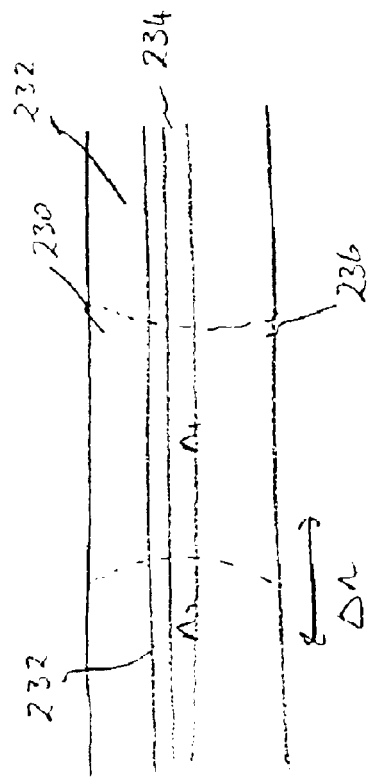

Another particular embodiment of a waveguide structure is schematically illustrated in FIG. 2C. A planar structure is formed by an upper cladding layer 230, and active layer 234 and a lower cladding layer 236. The active layer 234 may include one or more quantum wells. The upper cladding layer 230 may have higher losses than the lower cladding layer 236. Accordingly, the refractive index of the lower cladding layer 236 may be selected to be higher than the refractive index of the upper cladding layer 230, with the result that the transverse mode is pulled towards the lower cladding layer 236. Therefore the transverse mode becomes asymmetric. This reduces the overlap of the transverse mode in the upper cladding layer 230, thus reducing the upper cladding layer losses. This provides a particular advantage in long laser cavities, for example in excess of 1 mm, where a reduction in the upper cladding layer losses enhances the ability of the long cavity to provide high output power.

The lateral waveguide is formed between two low refractive index regions 232 which are formed by introducing one or more species into the semiconductor crystal. The low refractive index regions 232 may be formed by etching back around the active layer 234 and regrowing other material about the active region 234 to form a buried heterostructure. In another embodiment, the low refractive index regions may be formed using, for example, proton or ion implantation, diffusion, or some other suitable technique.

If used for pumping an erbium-doped fiber amplifier, a pump laser typically operates at about 980 nm. In one particular embodiment, a laser having AlGaAs cladding layers and an InGaAs active layer may be used to produce light at 980 nm. The operating wavelength of a pump laser for a Raman amplifier depends on the wavelength of signal being amplified. Where the optical signal to be amplified has a wavelength of about 1550 nm, the first Stokes Raman pump wavelength is about 1480 nm. In another particular embodiment, a laser having InP cladding layers and a GaInAsP active layer may be used to produce light at 1480 nm. It will be appreciated that different material combinations may be employed to achieve these particular wavelengths, and also that pump lasers may operate at wavelengths different from those described.

A laser of the design illustrated in FIGS. 2A and 2C was fabricated and tested. The cladding layers were formed of AlGaAs, while the active layer was a single InGaAs quantum well. The laser produced an output at approximately 980 nm. The narrow waveguide region had a width of approximately 2.3 μm and a length of 300 μm. The tapered region was also 300 μm long, and the wide region had a width of approximately 4.3 μm. The overall cavity length was in excess of 1 mm, being approximately 1500 μm. The end of the laser at the narrow waveguide region was provided with a highly reflective coating, and an antireflection coating was provided at the output end of the wide waveguide region. The average single pass loss through the cavity for the fundamental mode was approximately 50%.

Figure 3B:
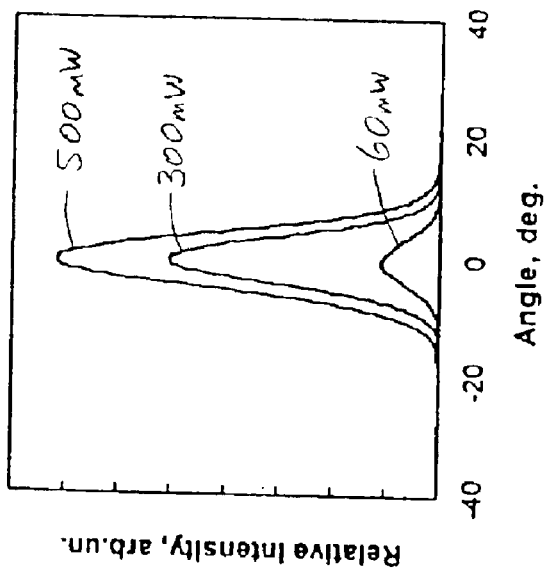
FIG. 3B illustrates far field lateral beam profiles for the output from a laser of the present invention, taken at different output power levels.
Figure 3A:
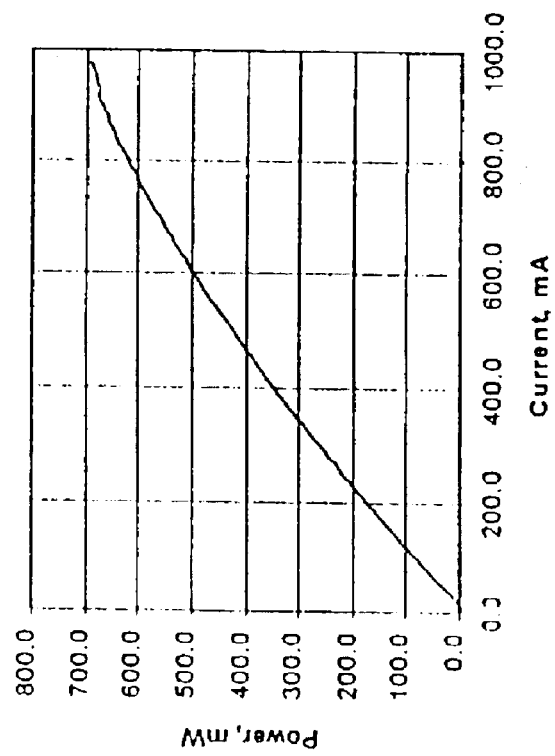
FIG. 3A illustrates a graph of light output plotted against continuous current for a laser of the present invention.

The output power of the laser was measured against current (L-I characteristic) under cw operating conditions. The results are shown in FIG. 3A. The output power increased monotonically to approximately 700 mW for a maximum injection current of approximately 1000 mA. The L-I characteristic shows a monotonic increase in power with current, and manifests no kink in output power.

The output beam profile was measured in the far field for the plane parallel to the junction. The resultant beam profiles measured at 60 mW, 300 mW and 500 mW output power are illustrated in FIG. 3B. The beam profiles are smooth and uniform for all currents. As shown in FIG. 3B, on either side of the peak intensity at 0°, the polarity of the slope of the far field beam profile remains constant with increase in divergence angle. The absence of any significant change in the far field beam profile at increased output power, and more specifically the lack of beam steering, is further evidence that there was no oscillation of the first order lateral mode, even for the highest power levels.

Figure 4:
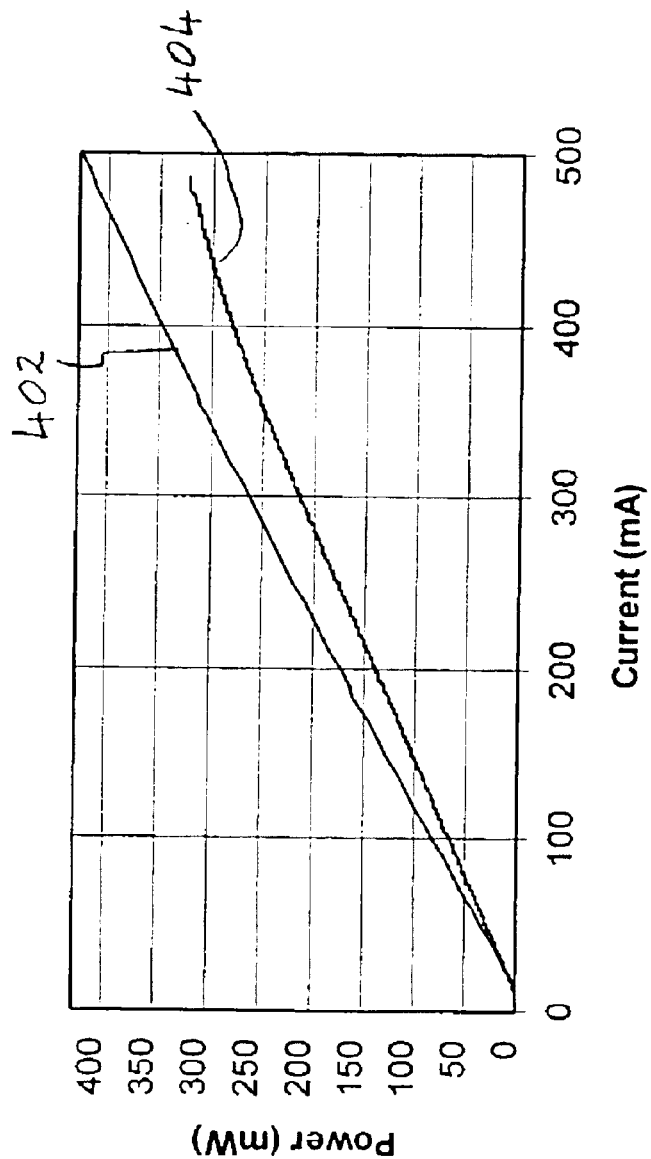
FIG. 4 illustrates output power and fiber coupled power as a function of continuous drive current for a laser of the present invention.

The L-I characteristic is repeated in FIG. 4 as curve 402, which also shows the efficiency 404 for coupling into a single mode fiber as a function of injection current. The output power at a current of 500 mA is about 400 mW, approximately 320 mW of which is coupled into the fiber. Thus the fiber coupling efficiency is about 80%. The laser maintains this high coupling efficiency even at relatively high operating powers.

Figure 5:
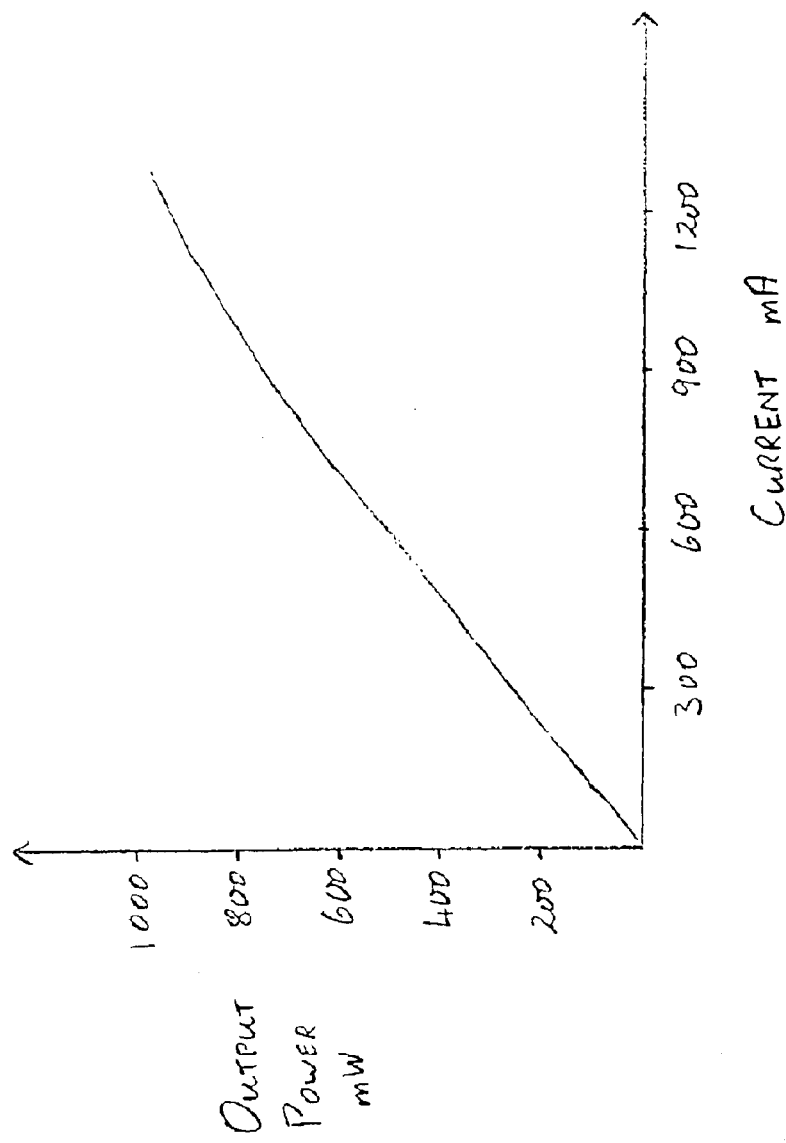
FIG. 5 illustrates a graph of light output plotted against pulsed current for a laser of the present invention.

The laser was operated at higher current levels under pulsed conditions. The laser was operated at 200 ns current pulses at a rate of 10 kHz. The L-I curve for pulsed operation, illustrated in FIG. 5, remained smooth up to a pulsed current level of 1200 mA, the limit of the power supply. The peak power of the laser at an injection current of 1200 mA was about 1000 mW. The laser showed no indication of oscillation of the first-order lateral mode, thus operating kink-free up to one Watt.

Figure 6:
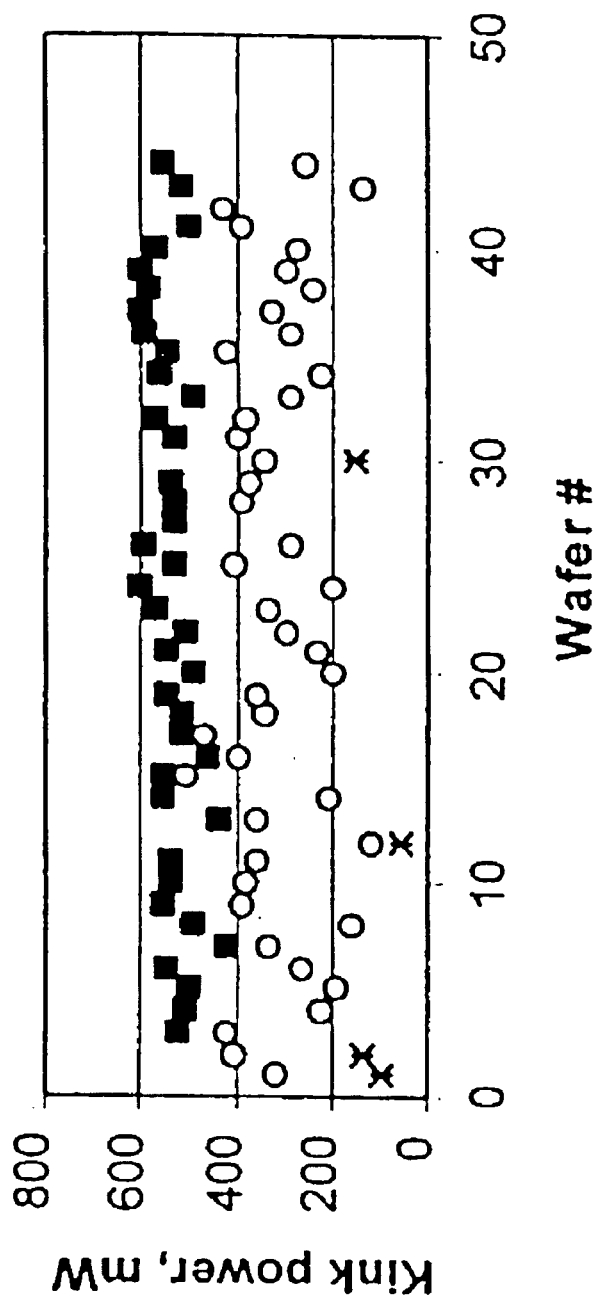
FIG. 6 graphically presents maximum power or kink power obtained from different laser devices.

The kink-power of the laser of the present invention was compared with the kink power of conventional straight stripe lasers. Several wafers were fabricated with lasers having tapered waveguides like that shown in FIG. 2A. Straight stripe lasers, having a stripe width of 3 μm, were also fabricated on the same wafers. The end facets of the chips were coated after cleaving from the wafer, and the chips were mounted for testing. A tapered waveguide laser, having its output at the end of the wide waveguide region, and a straight stripe laser from each wafer were each operated with cw current injection up to a current level of 800 mA. The maximum power reached by the tapered waveguide lasers, illustrated by the squares in FIG. 6, fell mostly in the range 500 mW–600 mW. No kink was observed for any of the lasers having the tapered waveguide and whose output was at the wide end of the waveguide. The power level at which kink occurred in the lasers having straight stripes is illustrated by the open circles in FIG. 5. The straight stripe lasers generally showed a kink power in the range 200 mW–400 mW.

A small number of tapered waveguide lasers was formed with the antireflection coating at the end of the narrow waveguide region, and the highly reflective coating at the end of the wide waveguide region. Therefore, the output of these lasers was emitted from the narrow end of the waveguide, rather than the wide end. These "reversed" tapered lasers, with the output extracted from the narrow end, showed a very low kink power, less than 200 mW.

As has been stated above, the high output powers available from the lasers of the present invention makes them well suited for pumping fiber amplifiers in fiber optic communications systems.

However, one particular problem of pumping fiber amplifiers is the presence of nonlinear parasitic processes, such as stimulated Brillouin scattering (SBS). This occurs when the power level of the pump light within a narrow linewidth becomes too high. The SBS threshold in a fiber for light from a distributed feedback (DFB) single-mode semiconductor laser, typically having a bandwidth of around 20 MHz, is generally in the range of 5 mW to 10 mW. These low SBS thresholds effectively cap the pump power deliverable from available sources, including single mode lasers, master oscillator/power amplifier (MOPA) systems, and even multi-longitudinal mode lasers, having a spectral intensity greater than about 10 mW per 20 MHz. Thus the requirement for high pump power conflicts with the parasitic losses.

Another problem is that conventional Fabry Perot or DFB lasers suffer from large fluctuations in output power and output spectrum that arise from changes in current or temperature. These fluctuations in output power and spectrum result in changes in the gain of the fiber amplifier, and the amplitude of the communications signal becomes unstable. Stabilization of the pump wavelength is required for achieving both gain flatness and for obtaining higher pump power by wavelength division multiplexing (WDM) of several pump lasers.

One approach to overcoming these problems is to operate the pump laser under coherence collapse by feeding the output from the laser to a frequency selective reflector to provide some degree of optical feedback. Operation of a pump laser under coherence collapse is described further in U.S. patent application Ser. No. 09/375,687, commonly owned with the present application and incorporated herein by reference. Operation under coherence collapse broadens the time-averaged spectrum of the output from the pump laser, while the frequency selective feedback stabilizes the output wavelength.

Figure 7A:
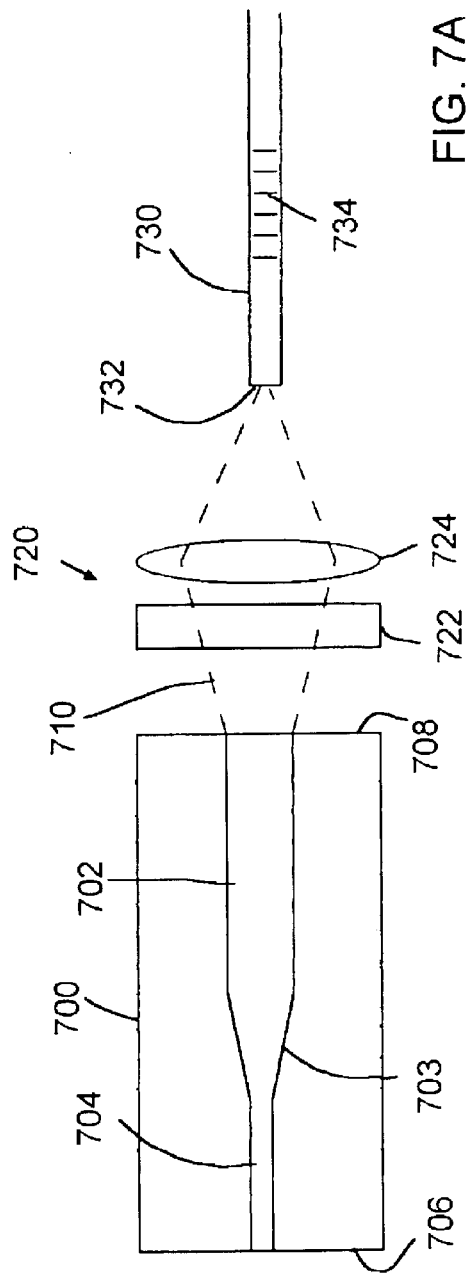
FIGS. 7A and 7B schematically illustrate an embodiment of the present invention including fiber grating wavelength stabilization.
Figure 7B:
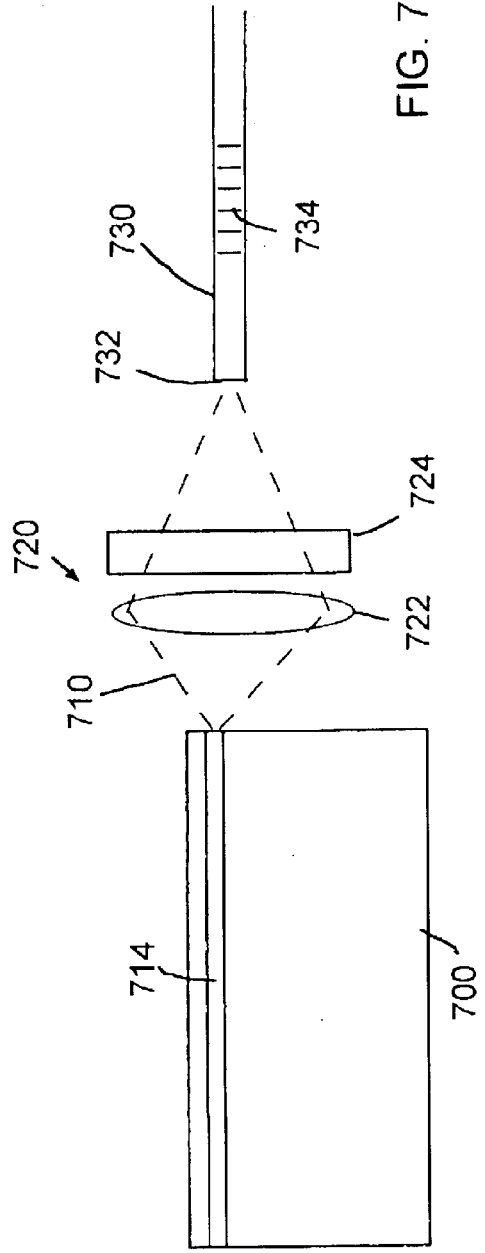

One embodiment of a fiber-grating stabilized pump laser is illustrated in FIGS. 7A and 7B, which show orthogonal views of a semiconductor tapered waveguide laser 700 whose output is coupled via a lens system 720 to a fiber 730. The laser 700 includes a narrow waveguide section 704 coupled at one end via a tapered waveguide section 703 to a wide waveguide section 702. The other end of the narrow waveguide section 704 is terminated at the rear facet 706, where there is a high reflection coating. The other end of the wide waveguide section 702 is terminated at the output end 708, where there may be a low reflectivity coating. The transverse waveguide 714 typically extends the length of the laser 700. Light 710 transmitted through the output end 708 is coupled by the lens system 720 into the input end 732 of the fiber 730. The fiber 730 is typically a single mode fiber and may be coupled directly to the fiber optic communications system to pump an amplifier. Furthermore, the fiber 730 may be of the polarization preserving type.

The lens system 720 may include one or more lenses. In the particular embodiment shown, the lens system 720 includes two lenses, the first lens 722 focusing the light 710 along the fast axis, in other words focusing the light in a direction perpendicular to the laser junction. The second lens 724 focuses light along the slow axis, in other words the direction parallel to the laser junction. It will be appreciated that other lens combinations may be employed to focus the output 710 from the laser 700 into the fiber 730.

The fiber 730 includes wavelength selective reflector 734, for example a fiber Bragg grating (FBG), that feeds light back to the laser 700 to lock the wavelength of the laser output to the wavelength of the reflector 734. In addition, the wavelength selective reflector 734 may reflect sufficient light back to the laser 700 to cause coherence collapse. Coherence collapse is described in "Regimes of Feedback Effects in 1.5 $\mu$m Distributed Feedback Lasers" by R. W. Tkatch and A. R. Chraplyvy, Journal of Lightwave Technology, vol. LT-4, pp. 1655–1661, 1986, incorporated herein by reference, and in U.S. Pat. Nos. 5,484,481, 5,563, 732 and 5,715,263, also incorporated herein by reference. In the coherence collapse regime, light from the laser is fed back into the laser cavity by an external reflector to perturb the laser spectrum. The onset of coherence collapse depends on several factors, including the reflectivity of the external reflector, the bandwidth of the external reflector, the separation between the external reflector and the laser and the coherence time of the laser.

Coherence collapse is characterized by a broad, time-averaged output spectrum, the bandwidth of which is related to the width of the reflectivity spectrum of the wavelength selective external reflector. The bandwidth of the coherence-collapsed output is broad, typically of the order of one GHz or more. This bandwidth is considerably broader than is found in single longitudinal mode operation, typically around 20 MHz, of a conventional distributed feedback (DFB) semiconductor laser, or MOPA with a DFB oscillator. Furthermore, the spectral density of the coherence-collapsed output is significantly less than that of a multimode Fabry-Perot semiconductor laser, where the laser power is restricted to the narrow Fabry-Perot modes lying within the overall operating bandwidth. As a result, the onset of SBS in the fiber occurs at significantly higher power levels under coherence-collapse than when conventional DFB or Fabry-Perot lasers are used. Consequently, the coherence collapsed laser is able to operate at a level of hundreds, if not thousands, of mW, without SBS onset, which is many times higher than the SBS threshold for conventional, narrowband lasers.

The wavelength selective reflector 734 may be a fiber Bragg grating (FBG) within the fiber 730 coupled to the laser output. The reflector 734 may also be some other type of reflector, for example a dielectric coating positioned on a substrate or an input face of a fiber, or some other suitable type of reflector that has a reflectance spectrum that may be selected to provide a desired coherence-collapsed laser output spectrum.

The reflectivity of the external reflector is typically less than 10%, for a position approximately within the range 0.5 m to 2 m from the laser, and preferably between 0.5 m and 1 m. The reflectivity of the external reflector is ideally selected to be as low as possible, in order to maximize throughput of the pump light to the fiber system, but should be sufficiently high to lock the laser wavelength to the wavelength of the wavelength selective reflector 734 and initiate coherence collapse. On the other hand, too high a reflectivity may cause a reduction in the fiber coupling efficiency, thus reducing the output power in the fiber. Furthermore, too high a reflectivity may, for certain separation distances between the external reflector and the laser, prevent coherence-collapsed operation. It will be appreciated, therefore, that the reflectivity of the FBG is selected to optimize the desired characteristics of the system.

It is advantageous for the peak gain wavelength of the laser to be close to the wavelength of maximum reflectivity in the wavelength selective reflector, since this results in increased output efficiency. Furthermore, since the peak gain wavelength of the laser is temperature dependent, the laser may be temperature tuned so that the wavelength of peak gain may be made approximately equal to the wavelength of maximum reflectivity. Furthermore, it is preferred that the temperature at which the wavelength of peak gain equals the wavelength of maximum reflectivity in the temperature range of 0° C. to 50° C.

Propagation of the light from the laser 700 through the fiber 730 may be subject to depolarization in the fiber 730, and so the distance between the reflector 734 and the laser 700 is preferably reduced to reduce depolarization effects. On the other hand, positioning the reflector 734 too close to the laser may result in narrow linewidth operation and/or produce mode-hopping instabilities.

In the particular embodiment illustrated, the bandwidth of the output from the laser 700 is determined, at least in part, by the reflectance bandwidth of the reflector 734, which may be selected according to the particular application. For example, where the laser 700 being used to pump a rare earth-doped fiber amplifier, the FBG reflection bandwidth may be selected so that the bandwidth of the light output from the laser 700 matches the absorption bandwidth of the dopant rare earth ions.

Another advantage provided by control of the laser bandwidth by an external fiber grating is that, where the laser is used to pump a fiber amplifier, the spectrum of the pump light becomes more stable, despite changes in current and temperature operation of the laser pumping the fiber amplifier. In conventional pump lasers, variations in the output spectrum arising from current or temperature changes may result in changes in pump power, which cause fluctuations in the amplitude of the optical communication signal. The spectrum of the coherence collapsed laser is characterized largely by the wavelength selective reflector. In the case of a fiber Bragg grating, the temperature sensitivity of the output spectrum is determined by the thermal properties of the fiber material, which is over ten times less sensitive to temperature than the semiconductor material of the laser. In contrast, conventional semiconductor lasers are typically subject to changes in the output spectrum resulting from a variety of effects, such as temperature change-induced mode-hopping, and long-term aging effects. Therefore, conventional semiconductor pump lasers may be particularly problematic for pumping rare-earth doped amplifiers, especially where the active species has a narrow absorption bandwidth.

Figure 8:
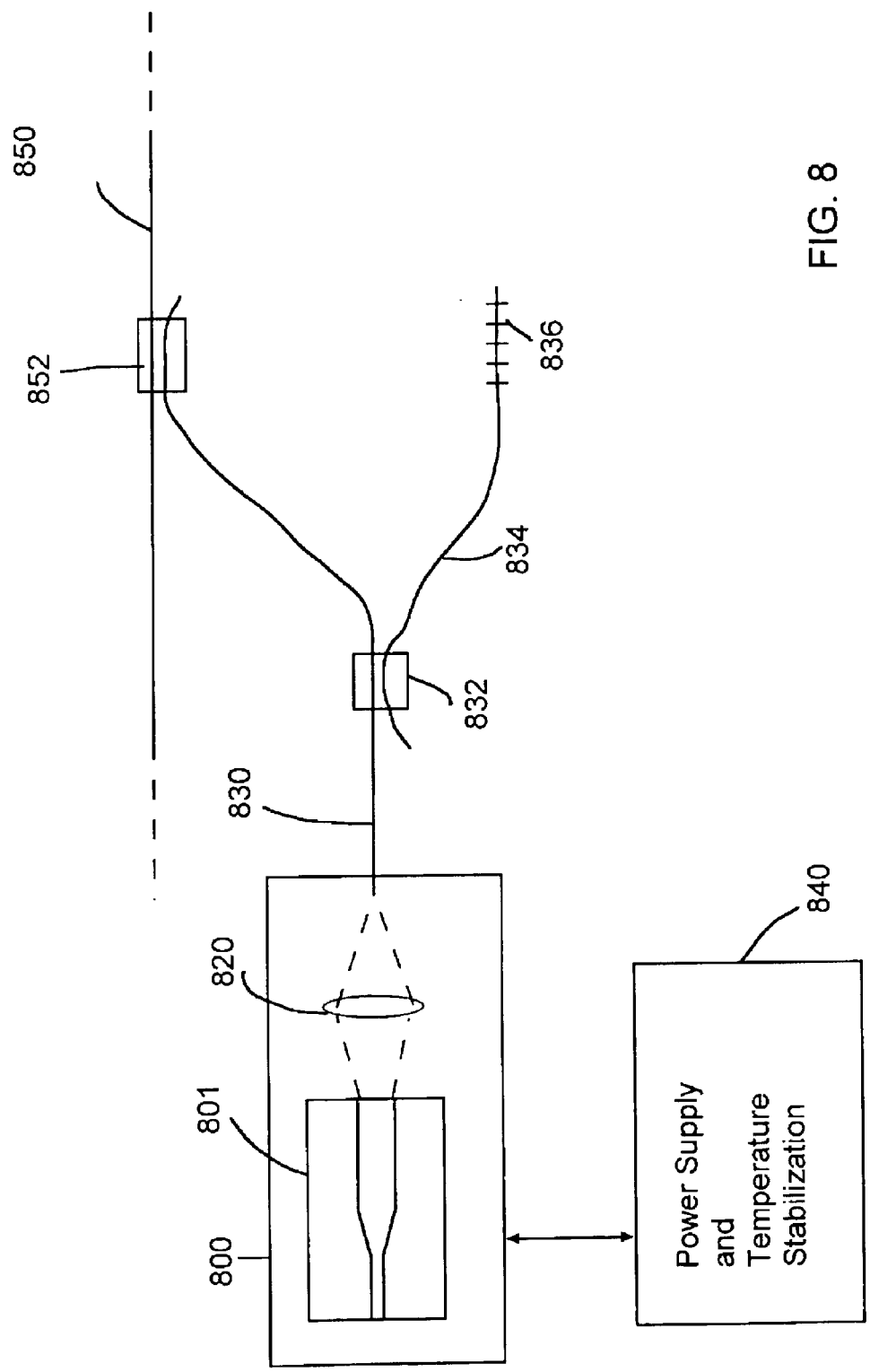
FIG. 8 schematically illustrates another embodiment of the present invention including fiber grating wavelength stabilization.

Another embodiment of a coherence-collapsed laser source is illustrated in FIG. 8 The laser source 800 includes a tapered waveguide laser 801 coupled to a first fiber 830 by a lens system 820. A coupler 832, operatively connected to the first fiber 830, is used to couple light from the first fiber 830 into a second fiber 834. The second fiber 834 includes a reflective element, such as an FBG 836. Light reflected by the reflective element 836 is fed back through the coupler 832 and the first fiber 830 to the laser 801. The reflectivity of the reflective element 836 and the separation distance between the laser 801 and the reflective element 836 may be selected to ensure that the laser 801 operates in the coherence collapse regime. An advantage of this embodiment is that the reflectivity or bandwidth of the reflecting element 836 may be changed without requiring alignment of the fiber 830 relative to the laser 801.

This embodiment is particularly useful where the feedback to the laser 801 is low. It is difficult to construct FBGs having a specific low reflectivity value, in part due to difficulties in measuring a low FBG reflectivity. This embodiment permits the use of a FBG 836 having a relatively high reflectivity, which is simpler to manufacture, and still achieves low feedback by using a coupler 832 that only directs a small portion of the light from the first fiber 830 to the second fiber 832. Since it is relatively straightforward to control the amount of light coupled to the second fiber 834 by the coupler 832, this embodiment permits low amounts of feedback.

A controller 840 may be attached to the laser source 800. The controller may operate as a power supply, providing current to the laser 801. The controller may also stabilize the operating temperature of the laser 801. For example, the laser 801 may include a thermoelectric cooler, operated by the controller 840, to cool to the laser 801 to a specific operating temperature. The laser 801 may also include a temperature sensor to provide feedback to the controller 840 to control the temperature.

The first fiber 830 is optically connected to an active fiber device 850 by a second coupler 852. The active fiber device 850 may be, for example, an amplifier that is part of an optical communications fiber link. The fiber amplifier may be a rare-earth-doped fiber, a Raman fiber amplifier, or any other type of fiber amplifier. The active fiber device may also be a fiber laser, such as a rare-earth doped laser, for example an erbium doped fiber laser, or may be a fiber Raman resonator.

As noted above, the present invention is believed to be applicable to high power single lateral mode semiconductor lasers. The invention is believed to be particularly useful for coupling high optical powers to fibers, for example for pumping fiber amplifiers. It will be appreciated that the laser described herein is not restricted to applications for pumping fiber amplifiers, but may be used wherever a high power, high quality output light beam is required or is desirable.

Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A light source, comprising:
   a semiconductor laser including a laterally confining optical waveguide having a reflecting first end and a second end, the optical waveguide having a first portion of a first width extending a first distance from the first end and a second portion of a second width, less than five microns, wider than said first width and extending a second distance from the second end, and a third portion extending from said first portion to said second portion and having a width that tapers from said second width of said second portion to said first width of said first portion;

wherein the first portion filters lateral optical modes higher than a fundamental lateral optical mode, and an output is emitted from the second end of the optical waveguide, such that a far field beam profile of said output emitted from the second end of the optical waveguide has a peak at 0°, and a respective slope of said far field beam profile on either side of said peak has a polarity that remains constant with increase in divergence angle; and whereby a threshold power of the semiconductor laser, at which a first order lateral optical mode begins to oscillate, is above 400 mW.

2. A light source as recited in claim 1, further comprising an optical fiber having an input end, the optical fiber including a wavelength-selective reflector to provide reflectance at a wavelength of light amplified in the semiconductor laser, and a light coupling system disposed to optically couple light from the second end of the optical waveguide into the input end of the optical fiber.

3. A light source as recited in claim 2, wherein the wavelength-selective reflector is a Bragg fiber grating disposed within the optical fiber.

4. A light source as recited in claim 2, wherein a reflectance value of the wavelength-selective reflector and a separation distance between the second end of the optical waveguide and the wavelength-selective reflector are selected to induce coherence collapse in light output from the laser.

5. A light source as recited in claim 4, wherein a separation distance between the first and second ends exceeds 1 mm.

6. A light source as recited in claim 4, wherein the reflectance value of the wavelength-selective reflector is less than 10%.

7. A light source as recited in claim 6, wherein the semiconductor laser has a gain spectrum having a peak gain wavelength, the peak gain wavelength being substantially equal to a peak reflectance wavelength of the wavelength-selective reflector at a semiconductor laser temperature between 0° C. and 50° C.

8. A light source as recited in claim 4, wherein a separation distance between the second end of the optical waveguide and the wavelength-selective reflector is in the range 0.5 m to 2 m.

9. A light source as recited in claim 2, wherein the wavelength-selective reflector reflects light within a selected reflection bandwidth, and light emitted by the semiconductor laser has a spectral bandwidth approximately equal to the reflection bandwidth.

10. A light source as recited in claim 1, wherein the second end of the optical waveguide is provided with an anti-reflection coating.

11. A light source as recited in claim 1, wherein each of the first and second waveguide portions have a substantially uniform respective width.

12. A light source as recited in claim 1, wherein the tapered portion of the optical waveguide has a length of at least 100 $\mu$m.

13. A light source as recited in claim 1, wherein the laterally confining optical waveguide is formed in a planar structure.

14. A light source as recited in claim 1, wherein an optical mode of the laterally confining optical waveguide is transversely asymmetric.

15. A light source as recited in claim 1, further comprising a temperature controller coupled to maintain the laser at a selected operating temperature.

16. A fiber optic system, comprising:
a communications fiber having a first end and a second end, the communications fiber including an excitable fiber medium; and
a pump laser coupled to supply pump light to the excitable fiber medium, the pump laser including a laterally confining optical waveguide having a first end of a first width provided with a high reflector, and a second end of a second width, the optical waveguide having a first portion of said first width and extending a first distance from the first end and a second portion of said second width, less than five microns, and wider than said first width, and extending a second distance from the second end, and a third portion extending from said first portion to said second portion and having a width that tapers from said second width of said second portion to said first width of said first portion;
wherein, the first portion filters out lateral optical modes higher than a fundamental lateral optical mode, and an output is emitted from the second end of the optical waveguide, such that a far field beam profile Of said output emitted from the second end of the optical waveguide has a peak at 0°, and a respective slope of said far field beam profile on either side Of said peak has a polarity that remains constant with increase in divergence angle;
whereby a threshold power of the pump laser, at which a first lateral optical mode begins to oscillate, is above 400 mW.

17. A system as recited in claim 16, further comprising a first optical fiber coupled to the communications fiber, and having an input end, the first optical fiber including a wavelength selective reflector providing reflectance at a wavelength of light amplified in the pump laser, and a light focusing system disposed to optically couple light from the second end of the optical waveguide into the input end of the first optical fiber.

18. A system as recited in claim 17, wherein the wavelength selective reflector includes a fiber Bragg grating disposed within the first optical fiber.

19. A system as recited in claim 17, wherein the wavelength selective reflector includes a second optical fiber optically coupled to the first optical fiber between the pump laser and the communications fiber, a fiber Bragg grating being disposed within the second optical fiber.

20. A system as recited in claim 17, wherein a reflectance value of the wavelength selective reflector and a separation distance between the second end of the optical waveguide and the wavelength selective reflector are selected to induce coherence collapse in light output from the laser.

21. A system as recited in claim 16, wherein the excitable fiber medium is a rare-earth doped fiber amplifier or a rare-earth doped fiber laser.

22. A system as recited in claim 16, wherein light output from the pump laser induces Raman gain in the excitable fiber medium.

23. A system as recited in claim 22, wherein the excitable fiber medium is a fiber Raman amplifier or a fiber Raman resonator.

24. A system as recited in claim 16, further comprising an optical transmitter coupled at a first end of the communications fiber to transmit optical signals along the communications fiber.

25. A system as recited in claim 16, further comprising an optical receiver coupled to receive optical signals at a second end of the communications fiber.

26. A system as recited in claim 16, further comprising a controller coupled to the pump laser to control operation of the pump laser.

27. A system as recited in claim 26, wherein the controller includes a power supply coupled to the pump laser to provide current to the pump laser.

28. A system as recited in claim 26, wherein the controller includes a temperature controller coupled to the PUMP laser to control a temperature of the pump laser.

29. The light source according to claim 1, wherein said first width is on the order of 2.3 microns and said second width is on the order of 4.3 microns.

30. The system according to claim 16, wherein said first width is on the order of 2.3 microns and said second width is on the order of 4.3 microns.

31. The light source according to claim 1, whereby the threshold power is above 1000 mW.

32. The system according to claim 16, whereby the threshold power is above 1000 mW.

33. A light source, comprising:

a semiconductor laser including a laterally confining optical waveguide having a reflecting first end and a second end, the optical waveguide having a first portion of a first width extending a first distance from the first end and a second portion of a second width, less than five microns, wider than said first width and extending a second distance from the second end, and a third portion extending from said first portion to said second portion and having a width that tapers from said second width of said second portion to said first width of said first portion;

wherein the first portion filters lateral optical modes higher than a fundamental lateral optical mode, and an output is emitted from the second end of the optical waveguide, such that a far field beam profile of said output emitted from the second end of the optical waveguide has a peak at 0°, and a respective slope of said far field beam profile on either side of said peak has a polarity that remains constant with increase in divergence angle; and whereby output power of the semiconductor laser monotoically increases with injection current to the semiconductor laser output power up to 700 mW.

\* \* \* \* \*